(12) United States Patent
Lin et al.

(10) Patent No.: US 9,837,610 B2
(45) Date of Patent: Dec. 5, 2017

(54) DISPLAY MODULE MANUFACTURING METHOD AND DISPLAY MODULE

(71) Applicant: AU OPTRONICS CORPORATION, Hsin-Chu (TW)

(72) Inventors: Jia-Hua Lin, Hsin-Chu (TW); Chih-Hung Tsai, Hsin-Chu (TW)

(73) Assignee: AU OPTRONICS CORPORATION, Hsin-Chu (TW)

(*) Notice: Subject to any disclaimer, the term of this patent is extended or adjusted under 35 U.S.C. 154(b) by 0 days.

(21) Appl. No.: 15/229,989

(22) Filed: Aug. 5, 2016

(65) Prior Publication Data

US 2016/0343939 A1   Nov. 24, 2016

Related U.S. Application Data

(62) Division of application No. 14/727,415, filed on Jun. 1, 2015, now Pat. No. 9,437,822.

(30) Foreign Application Priority Data

Aug. 1, 2014  (TW) .............................. 103126452 A

(51) Int. Cl.
*H04L 21/00* (2006.01)
*H01L 51/00* (2006.01)
(Continued)

(52) U.S. Cl.
CPC .......... *H01L 51/003* (2013.01); *G02F 1/1368* (2013.01); *G02F 1/133514* (2013.01);
(Continued)

(58) Field of Classification Search
CPC .... H01L 51/003; H01L 27/3244; H01L 51/56
See application file for complete search history.

(56) References Cited

U.S. PATENT DOCUMENTS 6,271,897 B1 * 8/2001 Ichikawa ............ G02F 1/13454
257/59
7,006,193 B2 * 2/2006 von Gutfeld ......... G02F 1/1339
349/190
(Continued)

FOREIGN PATENT DOCUMENTS

TW       201325904       7/2013
TW       I423739         1/2014

*Primary Examiner* — Laura Menz
(74) *Attorney, Agent, or Firm* — McClure, Qualey & Rodack, LLP

(57) ABSTRACT

The present invention provides a manufacturing method of a display module, including a step of disposing a substrate on a transparent carrier plate, wherein the substrate has a bottom surface and a supporting surface opposite to the bottom surface; the bottom surface is attached to the transparent carrier plate and includes a first area and a second area. A step of performing a display elements manufacturing process on the supporting surface. A step of etching the first area by a first energy having a first energy density passing through the transparent carrier plate to separate the first area from the transparent carrier plate. A step of etching the second area by a second energy having a second energy density passing through the transparent carrier plate to separate the second area from the transparent carrier plate, wherein the second energy density is greater than the first energy density. A step of separating the substrate from the transparent carrier plate.

7 Claims, 8 Drawing Sheets

(51) Int. Cl.
  *H01L 51/52* (2006.01)
  *G02F 1/1335* (2006.01)
  *G02F 1/1368* (2006.01)
  *H01L 27/32* (2006.01)
  *H01L 51/56* (2006.01)
  *H05B 33/08* (2006.01)

(52) U.S. Cl.
  CPC ...... *H01L 27/3244* (2013.01); *H01L 51/0017* (2013.01); *H01L 51/524* (2013.01); *H01L 51/56* (2013.01); *H01L 2227/323* (2013.01); *H01L 2227/326* (2013.01); *H05B 33/086* (2013.01); *H05B 33/0896* (2013.01)

(56) References Cited

U.S. PATENT DOCUMENTS

| | | | | |
|---|---|---|---|---|
| 8,773,625 B2* | 7/2014 | Li | ............... | G02F 1/1333 349/122 |
| 9,228,115 B2* | 1/2016 | Hwu | ............... | B32B 7/06 |
| 9,308,697 B2* | 4/2016 | Ke | ............... | H01L 27/1218 |
| 9,437,822 B2* | 9/2016 | Lin | ............... | H01L 51/0017 |
| 9,596,732 B2* | 3/2017 | Lin | ............... | H05B 33/26 |
| 2004/0081751 A1* | 4/2004 | Nakanishi | ............... | G02F 1/1345 427/108 |
| 2005/0094071 A1* | 5/2005 | Akiyama | ............... | G02F 1/133305 349/122 |
| 2005/0162576 A1* | 7/2005 | Sasaki | ............... | G02F 1/133707 349/33 |
| 2006/0003256 A1* | 1/2006 | Takahashi | ............... | G03F 7/0046 430/270.1 |
| 2006/0114406 A1* | 6/2006 | von Gutfeld | ............... | G02F 1/1339 349/190 |
| 2010/0035052 A1* | 2/2010 | Farah | ............... | G02B 6/30 428/336 |
| 2012/0164408 A1* | 6/2012 | Hwu | ............... | B32B 7/06 428/202 |
| 2014/0003022 A1* | 1/2014 | Lee | ............... | H05K 7/02 361/809 |
| 2014/0051192 A1* | 2/2014 | Lee | ............... | H01L 51/56 438/26 |
| 2014/0065393 A1* | 3/2014 | Lee | ............... | H01L 21/6835 428/216 |
| 2014/0072724 A1* | 3/2014 | Hwu | ............... | B32B 7/06 427/553 |
| 2014/0145587 A1* | 5/2014 | Yoon | ............... | H01L 21/6835 313/512 |
| 2014/0147577 A1* | 5/2014 | Lee | ............... | H01L 51/56 427/8 |
| 2015/0185526 A1* | 7/2015 | Wu | ............... | G02F 1/13338 156/275.5 |
| 2015/0236280 A1* | 8/2015 | Sakuishi | ............... | B32B 17/06 257/99 |
| 2015/0294951 A1* | 10/2015 | Smits | ............... | C09J 5/06 438/119 |
| 2016/0035978 A1* | 2/2016 | Lin | ............... | H01L 51/0017 257/88 |
| 2016/0057834 A1* | 2/2016 | Lin | ............... | H05B 33/26 313/511 |
| 2017/0141136 A1* | 5/2017 | Lin | ............... | H01L 27/1266 |

* cited by examiner

DISPLAY MODULE MANUFACTURING METHOD AND DISPLAY MODULE

The present application is a divisional application of U.S. application Ser. No. 14/727,415, filed Jun. 1, 2015 (now U.S. Pat. No. 9,437,822).

BACKGROUND OF THE INVENTION

1. Field of the Invention

The present invention generally relates to a manufacturing method of a substrate for display module. Particularly, the present invention relates to a manufacturing method of substrate for thin-type display module.

2. Description of the Prior Art

Liquid crystal display devices have been extensively applied to various electrical products including computer, television, and communication devices; in addition, the liquid crystal display devices are getting small, thin and light due to advancement of industrial technology and needs. Apart from the usual plane-surface character, display panels nowadays further has curved or flexible feature and go with variable display device designs, or provided for display device development. The display device itself may namely be the major part and accompanied with functions such as word processing, communication and data processing.

With regard to manufacturing flexible display panel/display device, generally, it is to form or cut a pliable flexible substrate first, then to dispose circuits, illumination material and/or light sources on the substrate. However, the flexible substrate itself may not be suitable for the manufacturing process under high temperature; accordingly, sheet materials may be required to assist in the process as a carrier of the pliable flexible substrate. After the process, releasing of the pliable flexible substrate from the carrier is processed by high-energy laser. However, different parts of the flexible substrate have different element disposed thereon, e.g. different element may be disposed in a visual area and a signal area, respectively. As a result, difference between elements and difference between different parts of the substrate resulted from manufacturing processes (e.g. there are thermal process and fastening glue-applying process in the signal area) may influence the releasing step. When higher energy is applied to the releasing step, the high energy may damage the elements in the visual area (e.g. OLED peeling or electric drift occurs); however, when applying lower energy, the releasing is not complete and there may be line defect.

SUMMARY OF THE INVENTION

It is an object of the present invention to provide a display module and manufacturing method thereof which has higher product quality.

The manufacturing method of display module of the present invention includes step (a) disposing a substrate on a transparent carrier plate; wherein the substrate has a bottom surface and a supporting surface opposite to the bottom surface; the bottom surface is attached to the transparent carrier plate and includes a first area and a second area; step (b) performing a display elements manufacturing process on the supporting surface; step (c) etching the first area by a first energy having a first energy density passing through the transparent carrier plate to separate the first area from the transparent carrier plate; step (d) etching the second area by a second energy having a second energy density passing through the transparent carrier plate to separate the second area from the transparent carrier plate, wherein the second energy density is greater than the first energy density; step (e) separating the substrate from the transparent carrier plate.

The display module of the present invention manufactured by the method includes a substrate which has a bottom surface and a supporting surface opposite to the bottom surface; wherein the bottom surface has a first area and a second area. A first average thickness exists between the first area and the supporting area is greater than a second average thickness between the second area and the supporting area.

DETAILED DESCRIPTION OF THE PREFERRED EMBODIMENT

Figure 1A:
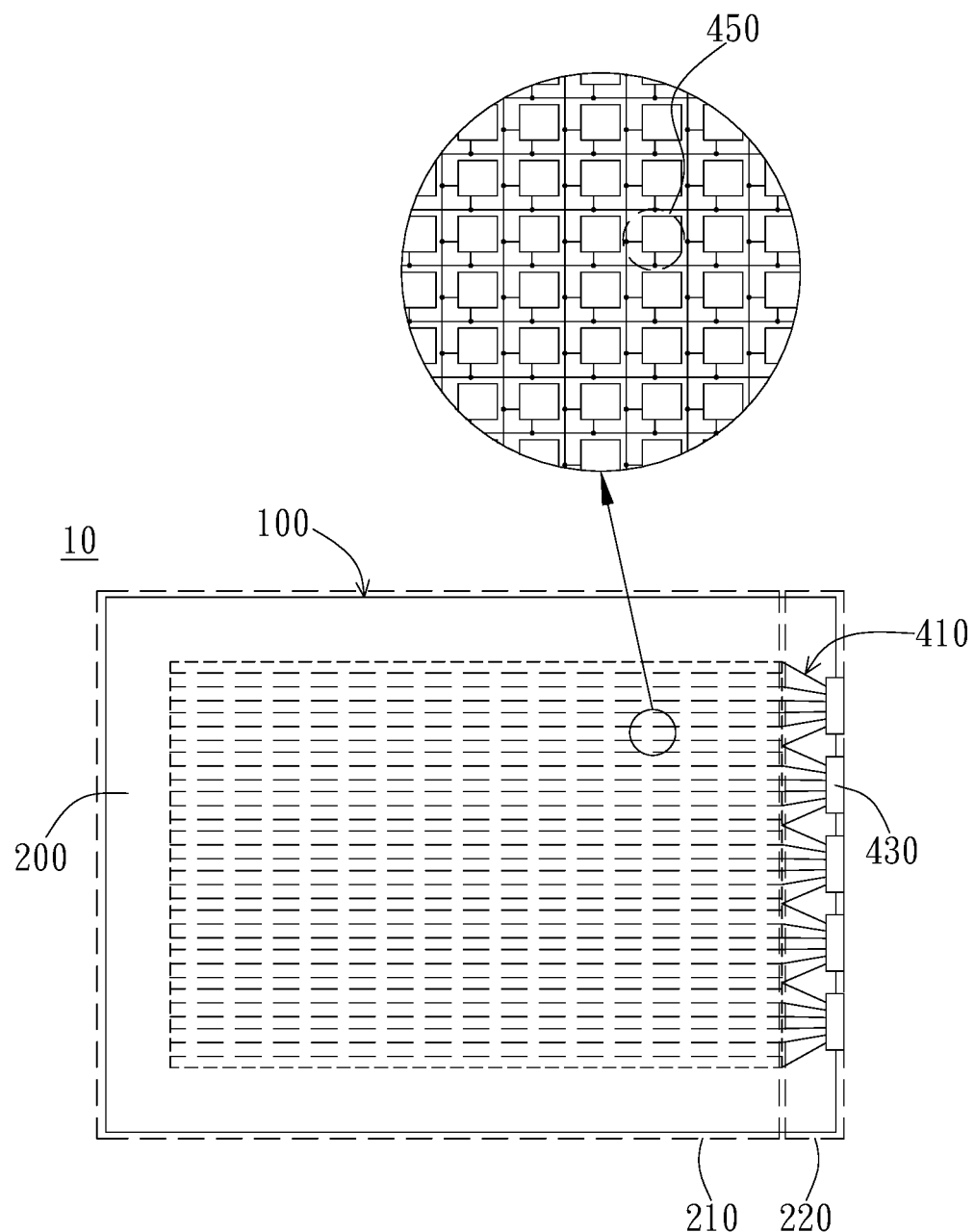
FIG. 1A shows a top view of an embodiment of the display module of the present invention.
Figure 1B:
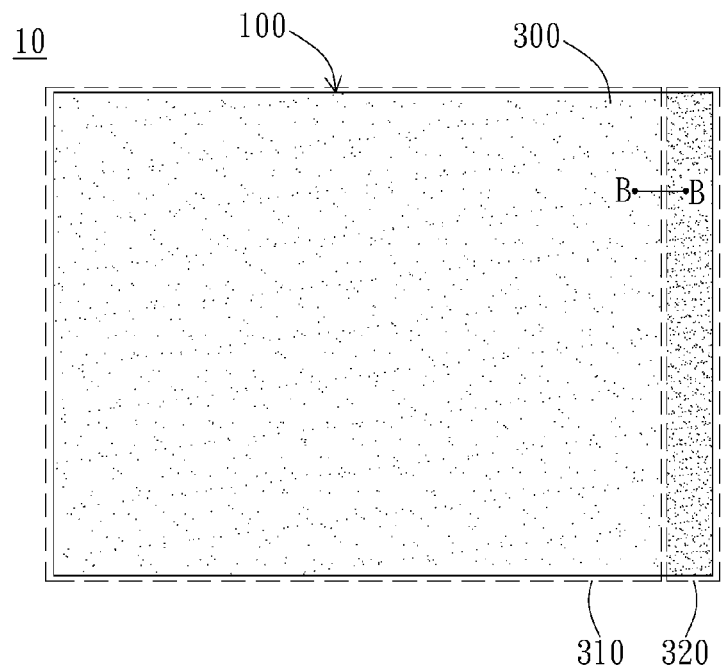
FIG. 1B shows a bottom view of an embodiment of the display module of the present invention.
Figure 2:
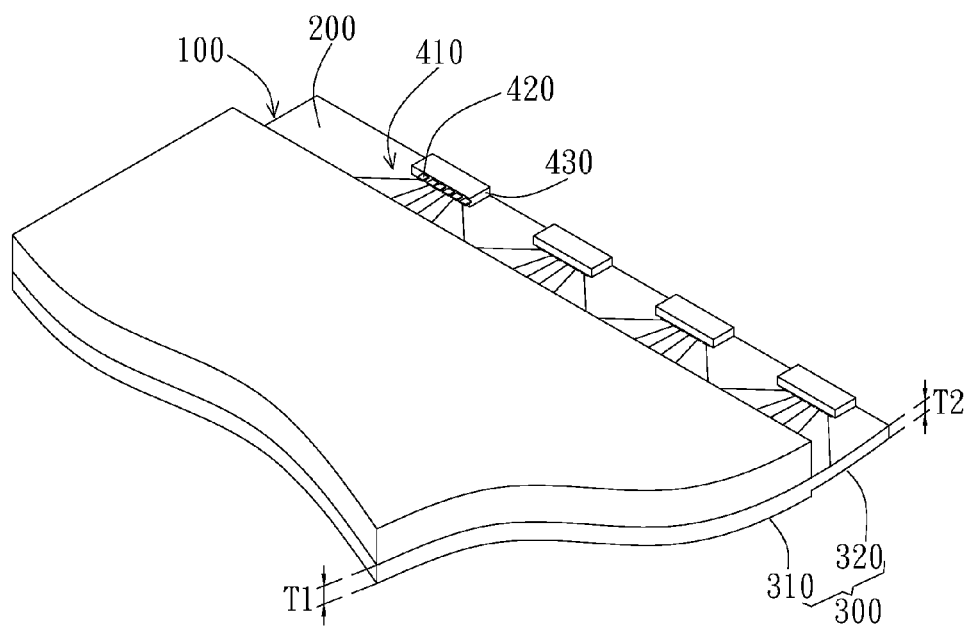
FIG. 2 is a partial three-dimensional view of the embodiment shown in FIGS. 1A-1B.

As shown in FIGS. 1A-2, the display module of the present invention includes substrate 100. For example, the substrate 100 is plastic material and preferably pliable and flexible. In a preferred embodiment, the substrate 100 may be plastic film. In addition, the display module 100 may be such as but not limited to LCD (liquid crystal display) module or OLED (organic light-emitting device).

The structure of the substrate 100 may include a supporting surface 200 and a bottom surface 300 opposite to the supporting surface 100, wherein a plurality of signal circuits, electrodes and/or driving element such as TFT (Thin-Film Transistor), and liquid crystals, illumination material and/or color filter are disposed on the supporting surface 200; in addition, a plurality of pixel units are formed on the supporting surface 200. An area of the supporting surface 200 in which a plurality of pixel units are disposed is a visual area 210. Apart from the visual area 210, the supporting surface 200 further has a signal area 220. The signal area 220 may be adjacent to one side of the visual area and usually arranged along the side of the visual area 210; in other embodiments, the visual area 210 may have more than one side adjacent to the signal area 220. As shown in FIG. 1A, the plurality of signal circuits 410 are connected to the electrodes and/or driving elements of the visual area 210; on the other hand, the signal circuits are disposed in the signal area 220. In addition, the display module 10 of the present embodiment further includes driving circuit 430 such as IC driver which is disposed in the signal area 220 and integrated with signal circuits 410 in the signal area 220. Further, the signal area 220 may at least partially a fan-out area and/or IC bonding area, wherein the plurality of signal circuits 410 crowd together in the signal area 220; the signal circuits 410 in each crowd may be distributed in the form of a specific shape; for example, the signal circuits 410 in the crowd may extend toward the pad 420 and simultaneously converge so that constitute a trapezoid or fan-like (so-called fan-out area) crowd of circuits. In addition, the driving circuit 430 such as the IC driver is disposed in the fan-out area and/or IC bonding area by means of various methods such as COG (chip on glass) and COF (chip on film).

Figure 4A:
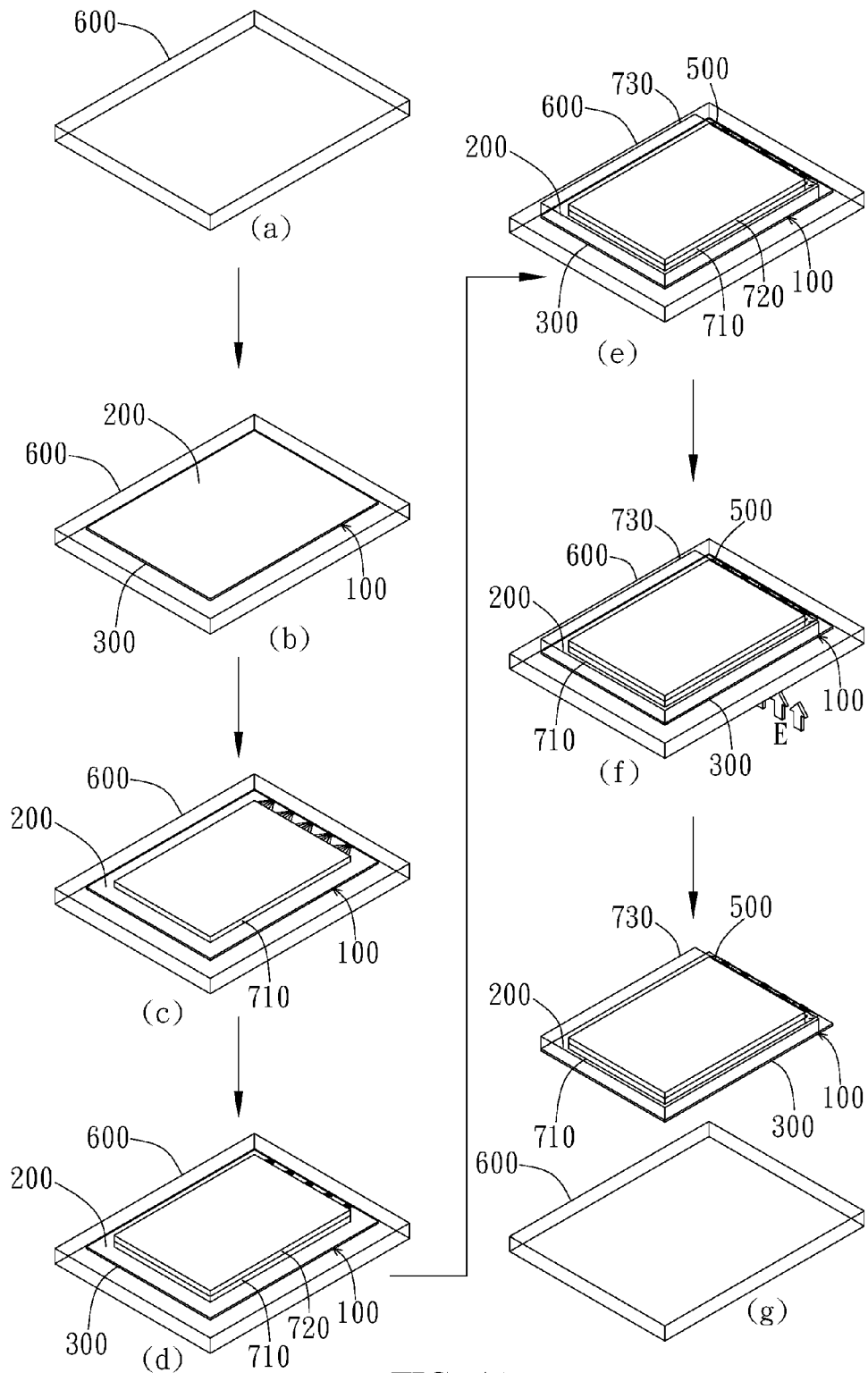
FIG. 4A-4D show schematic views of the manufacturing process of display module of the present invention.
Figure 4B:
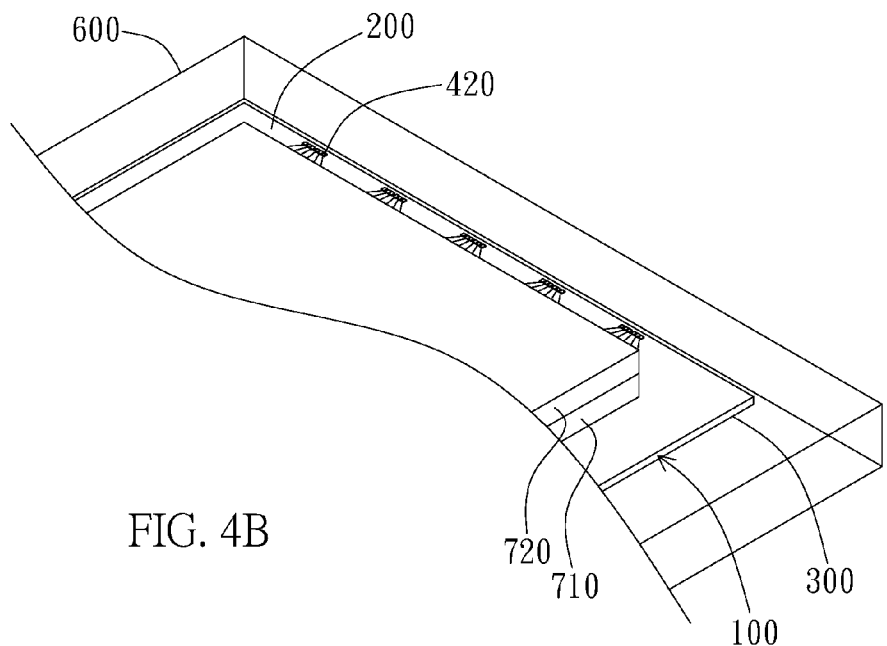
Figure 4C:
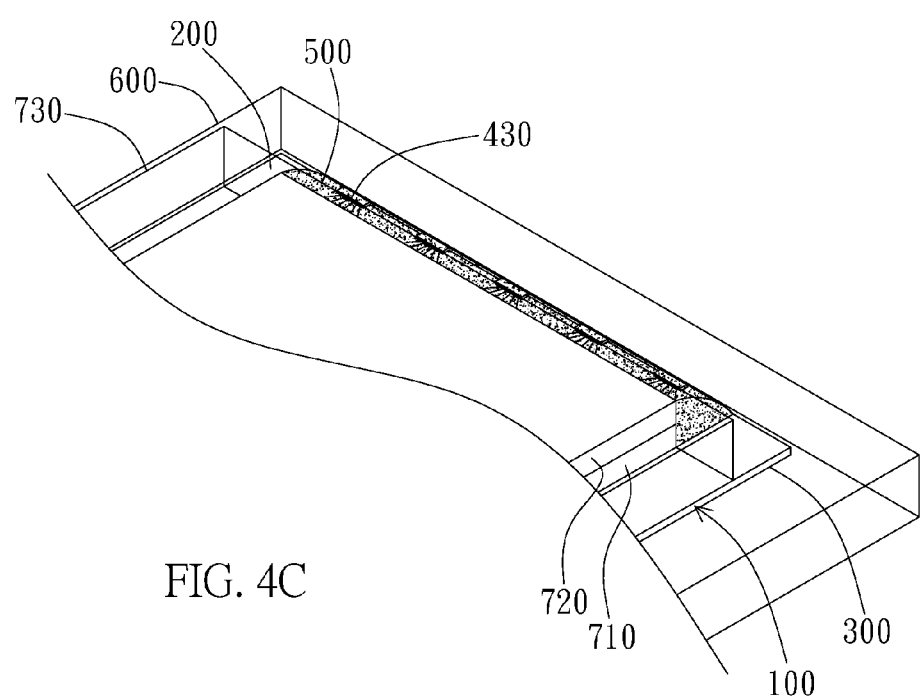
Figure 4D:
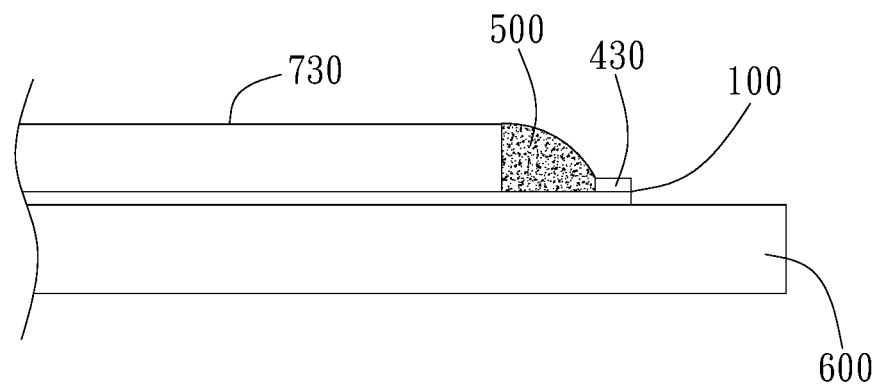

In the preferred embodiment of the present invention, a glue material is further disposed between the driving circuit 430 and the pixel unit 450 (please refer to FIG. 4D). The glue material not only connects an edge of the visual area 210, the substrate 100 and the driving circuit 430 but also reinforces a portion of the substrate 100 of the display module 10 between the visual area 210 and the driving circuit 430.

On the other hand, as shown in FIG. 1B, the bottom surface 300 of the substrate 100 has a first area 310 and a second area 320. In the embodiment, the first area 310 further corresponds to the opposite supporting surface 200, i.e. the visual area 210; the second area 320 corresponds to the signal area 220. In addition, a distance existing between the first area 310 and the supporting surface 200 does not equal to a distance existing between the second area 320 and the supporting surface 200; in other words, the substrate 100 is uneven in its thickness. Further speaking, an average thickness of the substrate 100 at one portion does not equal to an average thickness at another portion. In the present embodiment, as shown in FIG. 2, a first average thickness T1 exists between the first area 310 and the supporting surface 200, a second average thickness T2 smaller than the T1 exists between the second area 320 and the supporting area 200. Preferably, the difference in thickness of the substrate 100 reflects the manufacturing method of the display module of the present invention. The manufacturing method of the display module 10 is described as the following.

Figure 3:
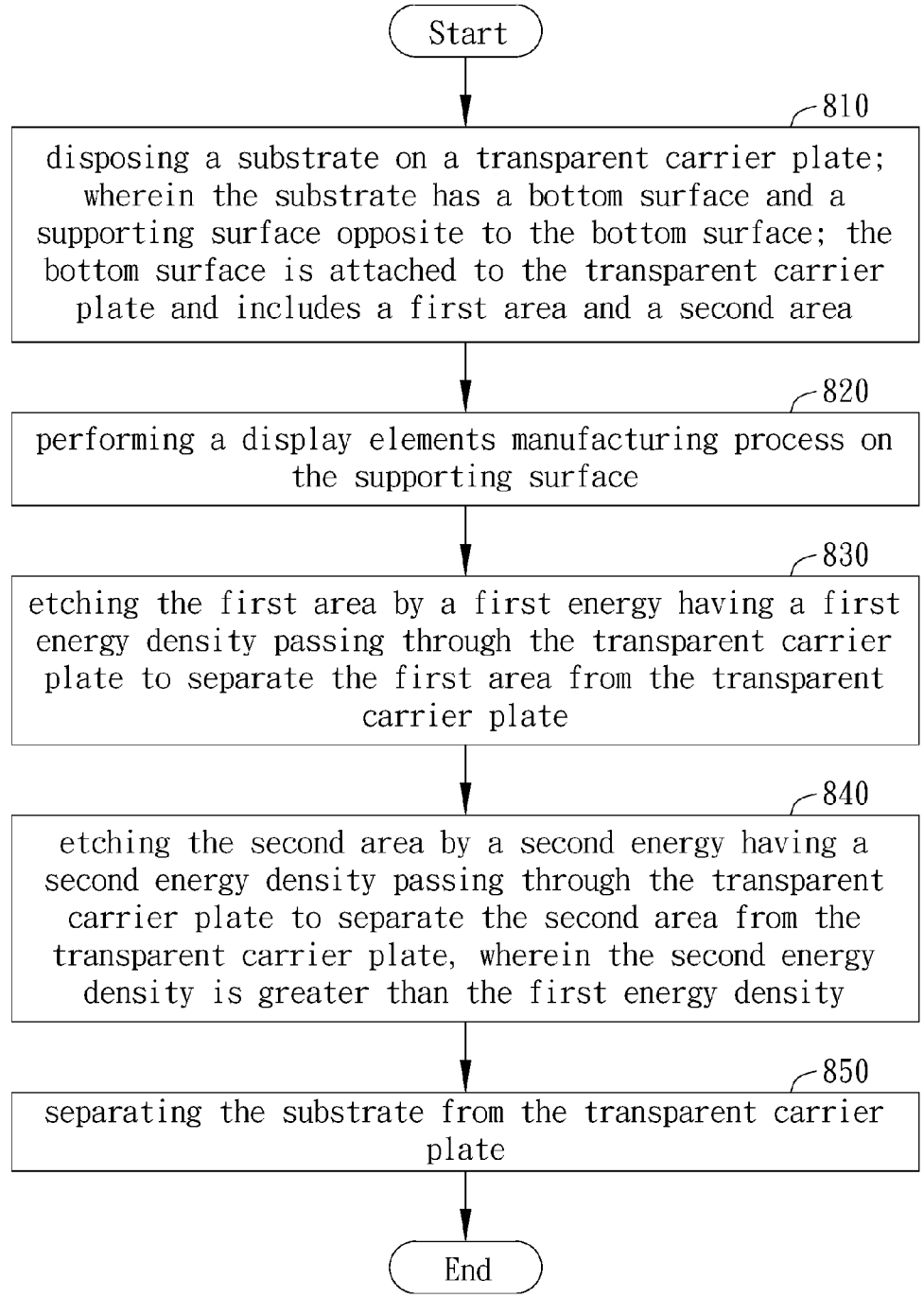
FIG. 3 is a flow chart of the manufacturing method of display module of the present invention.

As shown in FIG. 3, the manufacturing method of display module of the present invention includes step 810 which is disposing a substrate on a transparent carrier plate; wherein the substrate has a bottom surface opposite to a supporting surface, the bottom surface is attached to the transparent carrier plate and includes a first area and a second area.

Since the substrate 100 of the display module 10 has flexibility and is usually intolerance toward high temperature, a carrier plate is provided to assist in the manufacturing of the display module 10. The carrier plate preferably has transparency such as being a glass plate; accordingly, in the follow-up releasing process, optical energy can pass through the carrier plate and be applied to an interface between the carrier plate and the substrate 100. In addition, the substrate 100 may be directly formed on the carrier plate so as disposed on the substrate 100, wherein the carrier plate is as the transparent carrier plate 600 shown in FIGS. 4A-4D. For example, material of the substrate 100 is coated on the transparent carrier plate 600 to form the substrate 100.

Figure 5:
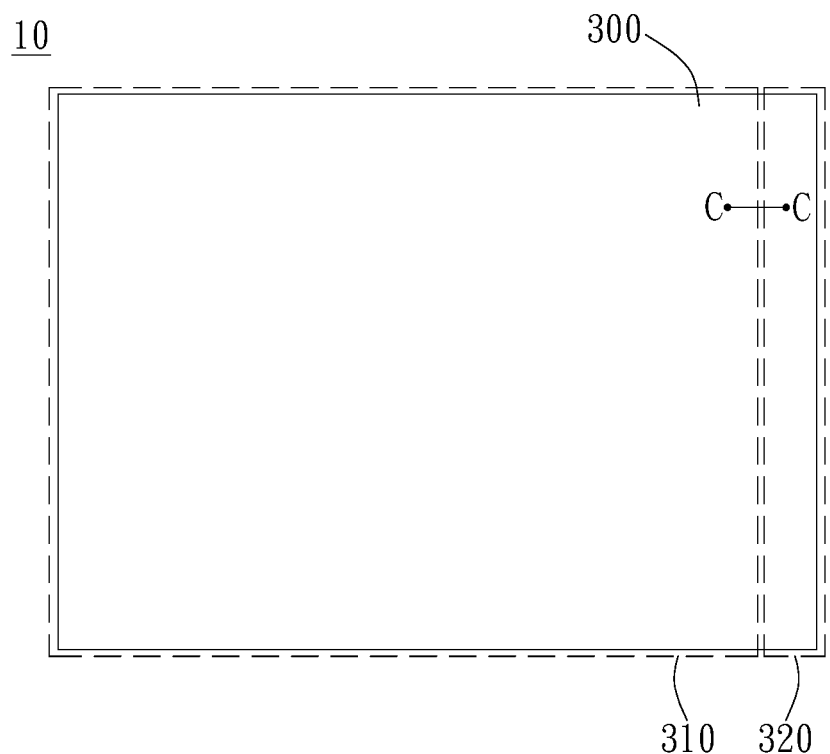
FIG. 5 shows a schematic view of the manufacturing process of display module of the present invention.

The substrate 100 has a bottom surface 300 and a surface facing outsides. The bottom surface 300 is attached to a surface of the transparent carrier plate 600, the surface facing outsides serves as the supporting surface 200; as shown in FIG. 4A(b). In addition, as shown in FIG. 5, considering the follow-up steps of the manufacture of the display module 10, the bottom surface 300 is pre-assigned to include at least the first area 310 and the second area 320. Not only the exterior of the substrate 100, i.e. the bottom surface 300 of the substrate 100, the first area 310 and the second area 320 preferably includes a depth starting from the surface of back side of the substrate 100. In the stage of the manufacturing shown in FIG. 5, there is no substantial difference between the first area 310 and the second area 320; however, in accordance with such assignment, different areas such as the first area 310 and the second area 320 can be treated differently.

The manufacturing method of the display module 10 further includes step 820 which is performing a display elements manufacturing process. For example, step 820 can further include disposing a plurality of signal circuits, electrodes and/or driving elements such as TFT, and liquid crystals, illumination material and/or color filter on the supporting surface 200. In the preferred embodiment of the present invention, as shown in FIG. 4A(c)-4A(d), a plurality of pixel units are formed on the supporting surface 200 (please refer to FIGS. 1A, 2 and 4B as well), wherein TFT (Thin-Film Transistor) array 710 and organic illumination material are disposed on the supporting surface 200; for example, an organic film layer 720 is formed by means of vapor or liquid phase deposition, coating or electroplating. In addition, it is preferred to form a thin film encapsulation 730 outsides the organic film layer 720, as shown in FIG. 4A(e). Substrate 100 of the display module 10 formed in this way could serve as a substrate of OLED (organic light-emitting device).

The area on the supporting surface 200 in which the plurality of pixel units are disposed is the visual area 210; alternative, the step 820 includes assigning the supporting surface 200 to include the visual area 210 and disposing a plurality of pixel units in the visual area 210. In the preferred embodiment of the embodiment, the visual area 210 corresponds to the opposite first area 310, i.e. the first area 310 of the bottom surface 300. Further, the above-mentioned step of forming the plurality of signal circuits preferably includes disposing the signal circuits of the TFT array 710 aside the visual area 210. Where the signal circuits 410 are located is the signal area 220 of the supporting area 200. Alternatively, the step 820 includes assigning the supporting surface 200 to include the visual area 210 and the signal area 220 and to dispose the plurality of signal circuits 410 in the signal area 220; wherein the signal area 220 is preferably arranged along a side of the visual area 210. For example, the plurality of signal circuits 410 crowd together in the signal area 220, wherein the signal circuits 410 in each crowd may be distributed in the form of a specific shape; for example, the signal circuits 410 in the crowd may extend toward the pad 420 and simultaneously converge so that constitute a trapezoid or fan-like (so-called fan-out area) crowd of circuits.

The step 820 preferably further includes disposing driving circuit 430 such as IC driver in the signal area 220 to drive the pixel units (please refer to the pixel units 450 shown in FIG. 1A as well), as shown in FIG. 4A(e) and its partially enlarged view shown in FIG. 4C. On the other hand, in the preferred embodiment of the present invention, the step 820 preferably includes fill a glue material 500 between the driving circuit 430 and the pixel units 450.

The manufacturing method of the display module 10 of the present invention further includes step 830, which is etching the first area by a first energy having a first energy density passing through the transparent carrier plate to separate the first area from the transparent carrier plate. The step 830 is also called a process of releasing, wherein first energy is such as a first energy beam. In the preferred embodiment of the present invention, the energy beam may be a laser beam such as UV laser. In addition, the above-mentioned assignment of the first area 310 and the second area 320 may be proceeded in this step.

Figure 6A:
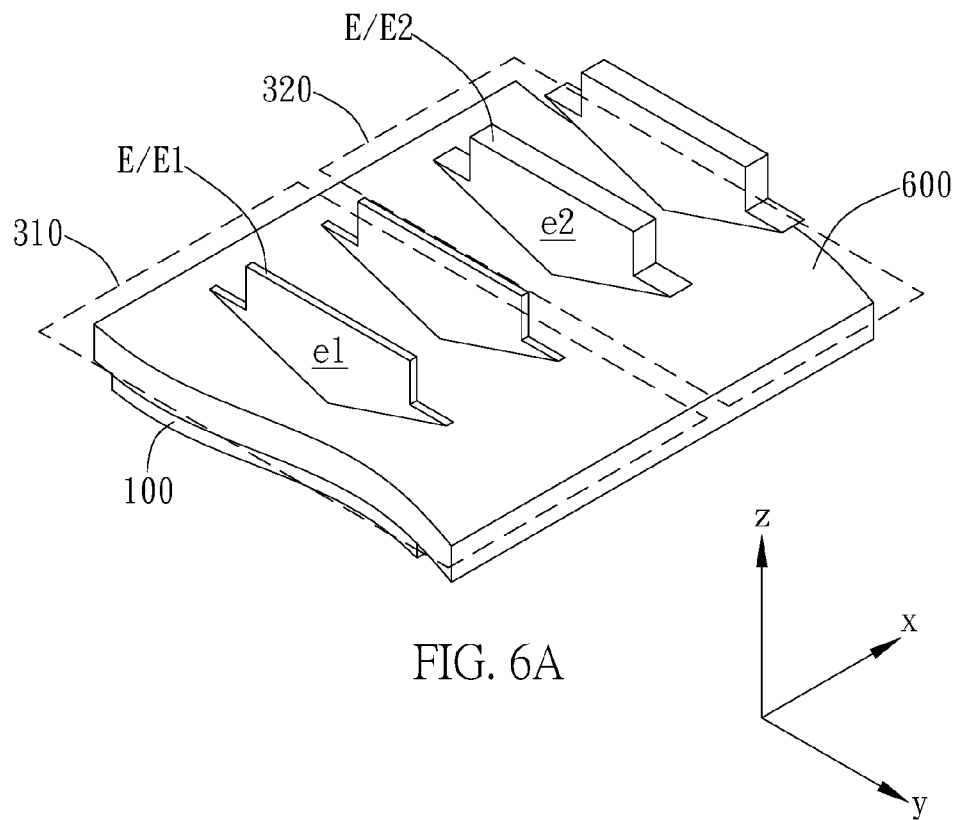
FIGS. 6A-6B show schematics views of the manufacturing process of display module of the present invention.
Figure 6B:
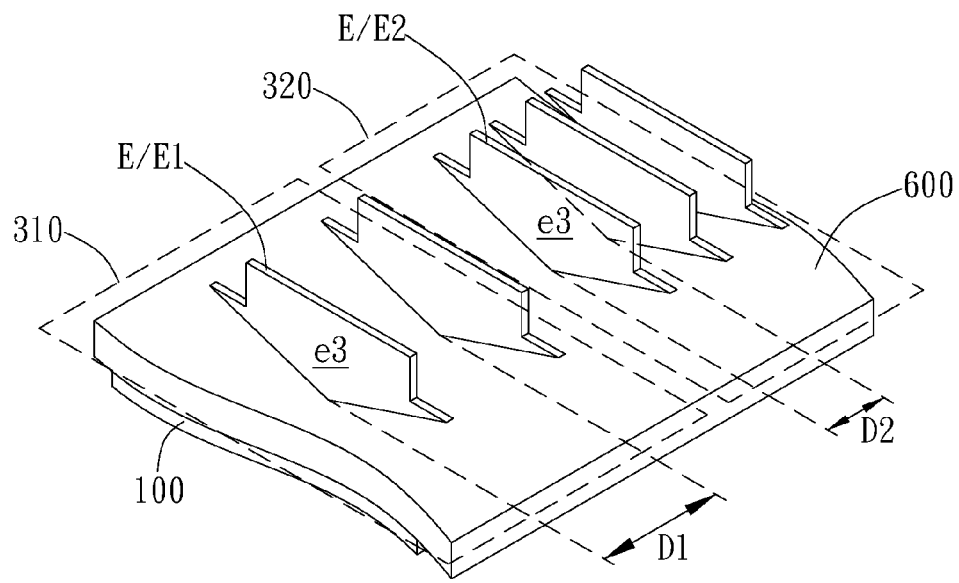

Please refer to FIG. 4A(f) and FIGS. 6A-6B, the energy beam E may be emitted into the transparent carrier plate 600 from a side of the transparent carrier plate 600 opposite to the side having the substrate 100 disposed thereon. The energy beam E may penetrate the transparent carrier plate 600 and preferably arrive in the first area 310 of the substrate 100 attached to the transparent carrier plate 600. The energy beam may decompose or damage the bottom surface 300 of the substrate 100 attached to the transparent carrier plate 600 so as release the attachment of the substrate 100 to the transparent carrier plate 600 and let them separate from each other. In other words, the bottom surface 300 is etched by the energy beam; in addition, the energy may result in notches on the bottom surface 300.

Further, the first energy may be composed of a plurality of energy beams. For example, in the embodiments of the present invention, a plurality of first energy beam scan an area such as the first area 310 so as apply the first energy to the first area 310 (i.e. etch the first area). The energy beam or the first energy composed of the plurality of energy beams may be represented by a unit such as mJ/cm$^2$ (i.e. energy per unit area or an energy density (of first energy beam)). Take the embodiment shown in FIG. 6A for example, each of a plurality of first energy beams E1 which expends along an extension direction Y and has a first energy density e1 is emitted into the transparent carrier plate 600. On the other hand, a plurality of the first energy beams E1 which are arranged along an extension direction X are emitted into the transparent carrier plate 600 and pass through the same so that apply the first energy to the first area 310. The first energy beams E1 may be those beams emitted from a light source, scanning the first area 310 of the transparent carrier plate 600 along the direction X and entering the transparent carrier plate 600 by sequence. In addition to energy density, it is able to control the first energy by means of adjusting a distance existing between the first energy beams E1 and/or time interval between the first energy beams' turning up.

The manufacturing method of the display module 10 of the present invention further includes step 840, which is etching the second area by a second energy having a second energy density passing through the transparent carrier plate to separate the second area from the transparent carrier plate. The step 840 is also called a process of releasing, wherein the second energy is such as a second energy beam and similar or like the first energy. Please refer to both FIG. 4A(f) and FIGS. 6A-6B, the energy beam E may be emitted into the transparent carrier plate 600 from the side of the transparent carrier plate 600 opposite to the side having the substrate 100 disposed thereon. The energy beam E may penetrate the transparent carrier plate 600 and preferably arrive in the second area 320 of the substrate 100 attached to the transparent carrier plate 600.

Further, the second energy may be composed of a plurality of energy beams. For example, in the embodiments of the present invention, a plurality of second energy beams scan an area such as the second area 320 so as apply the second energy to the second area 320 (i.e. etch the second area). The energy beam or the second energy composed of the plurality of energy beams may be represented by the unit such as mJ/cm$^2$ (i.e. energy per unit area or an energy density (of second energy beam)). Take the embodiment shown in FIG. 6A for example, each of a plurality of second energy beams E2 which expends along the extension direction Y and has a second energy density e2 is emitted into the transparent carrier plate 600. On the other hand, a plurality of the second energy beams E2 which are arranged along the extension direction X are emitted into the transparent carrier plate 600 and pass through the same so that apply the second energy to the second area 320. The second energy beams E2 may be those beams emitted from a light source, scanning the second area 320 of the transparent carrier plate 600 along the direction X and entering the transparent carrier plate 600 by sequence. In addition to energy density, it is able to control the second energy by means of adjusting a distance existing between the second energy beams E2 and time interval between the second energy beams' turning up.

As shown in FIG. 6A, energy per unit area of the first energy beam E1 is different from energy per unit area of the second energy area E2. For example, the energy per unit area of the first energy beam E1 is less than the energy per unit area of the second energy beam E2; accordingly, on the bottom surface 300 per unit area of the first area 310 is etched by the first energy density e1, per unit area of the second area 320 is etched by the second energy density e2 which is higher than the first energy density e1. Difference between the energy per unit area of the first energy beam E1 and the energy per unit area of the second energy beam E2 may be around 10%.

In addition, after the steps 830 and 840, the first area 310 of the bottom surface 300 of the substrate 100 may be distinguishable from the second area 320. For example, as shown in FIGS. 2 and 6B, the second area 320 may be etched deeper due to the higher second energy density; in other words, resulting in greater indentation. This may also let a thickness (namely the second average thickness T2) between the supporting surface 200 and the second area 320 of the bottom surface 300 be smaller than a thickness (namely a first average thickness T1) between the first area 310 and the supporting surface 200. Please note that the first energy beam E1 and the second energy beam E2 shown in FIGS. 6A-6B by arrows represent directions of (energy) beams and relative intensities of the energy per unit area but not directly reflect width or length of the (energy) beams.

On the other hand, take the embodiment shown in FIG. 6B for example, energy density e3 of the first energy beam E1 may equal to energy density e2 of the second energy beam E2, i.e. the energy per unit area of the first energy beam applied to the first area 310 of the bottom surface 300 may equal to the energy per unit area of the second energy beam applied to the second area 320 of the bottom surface 300. For example, the first energy density and the second energy density which are different from each other may result from different distances and/or different time interval. Specifically, the first energy beam E1 and the second energy beam E2 may have the same energy density of beam such as the energy density e3; however, the distance existed between the (adjacent) first energy beams E1 may not equal to the distance existed between the (adjacent) second energy beams E2, the time interval between the (adjacent) first energy beams E1 may not equal to the time interval between the (adjacent) second energy beams E2. In other words, same energy beam can provide different first energy density of the first energy and second energy density of the second energy by means of different scanning density. In a preferred embodiment, the distance and/or the time interval between the adjacent energy beams is determined by a distance of midlines of the adjacent energy beams. Take the embodiment shown in FIG. 6B; for example, the adjacent first energy beams E1 has a first midline distance D1, the adjacent second energy beams E2 has a second midline distance D2; accordingly, the energy per unit area applied to the second area 320 is greater than the energy per unit area applied to the first area 310, namely etching per unit area of the first area 310 of the bottom surface 300 with slighter energy and etching per unit area of the second area 320 with greater energy so that make the first area 310 and the second area 320 of the bottom surface 300 of the substrate 100 be distinguishable from each other after the steps 830 and/or 840. By means of the method shown in FIG. 6A or 6B, a difference between the thicknesses may be greater than 10 nm, wherein one of the thicknesses is the thickness between the first area 310 and the supporting surface 200, the other is the thickness between the second area 320 and the supporting surface 200.

Figure 7:
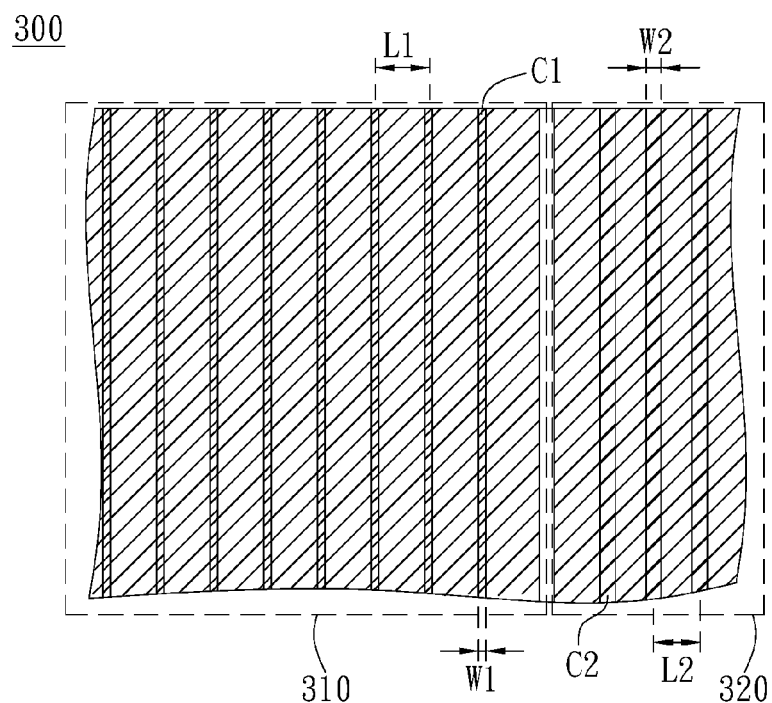
FIG. 7 shows a schematic view of energy-scanning area in the manufacturing process of display module of the present invention.

As described above, the energy beam etches the bottom surface 300 of the substrate 100 and results in the indentation; position and pattern of the indentation may correspond to the energy beam. On the other hand, the first area 310 and the second area 320 may have substantial difference due to the indentations resulted from the steps 830 and 840. Take the embodiment shown in FIG. 7 for example. FIG. 7 demonstrates at least one position on the bottom surface 300 of the substrate 100 where the energy beam passing through the transparent carrier plate 600 (please refer to the transparent carrier plate 600 shown in FIGS. 6A-6B as well) arrives and etches the bottom surface 300 of the substrate 100; FIG. 7 also demonstrates a comparison between at least one indentation of at least one portion of the bottom surface 300 under repeated beam scanning (etching) and other indentation of other portion, wherein a plurality of first indentations C1 in the first area 310 correspond to the portions where the first energy beam arrives repeatedly, a plurality of second indentations C2 in the second area 320 correspond to the portions where the second energy beam arrives repeatedly; please refer to FIG. 6B as well for the arriving of the first energy beam and the arriving of the second energy beam. A first (midline) distance L1 exists between two adjacent first indentations C1, a second (midline) distance L2 exists between two adjacent second indentations C2. Preferably, the first distance L1 is greater than the second distance L2; the difference between the first distance L1 and the second distance L2 also reflects that compared to the first energy beam, the second energy beam scans the second area 320 of the bottom surface 300 more densely. In the embodiment, energy density of beam of the first energy beam preferably equal to energy density of beam of the second energy beam but not limited thereto; it is allowable that compared to the energy applied to per unit area of the first area 310, greater energy is applied to per unit area of the second area 320.

As mentioned above, compared to the first energy beam, the second energy beam scans the second area 320 of the bottom surface 300 more densely; accordingly, portions of the bottom surface 300 scanned repeatedly and more densely by the energy beam(s) have indentations having greater width. As shown in FIG. 7, the second indentation C2 has a second width W2. In comparison to the first indentation C1, the second width W2 is greater than a first width W1 of the first indentation C1. In other embodiments, the second indentation C2 may be formed by the second energy beam which results in larger incidence area.

As shown in FIG. 7, areas on the bottom surface 300 in which the energy beam arrives preferably overlap. Accordingly, the adjacent first indentations C1 overlap and the adjacent second indentations C2 overlap, wherein a measure of area of the overlapping of the adjacent second indentations C2 is greater than a measure of area of the overlapping of the adjacent first indentations C1.

Figure 8:
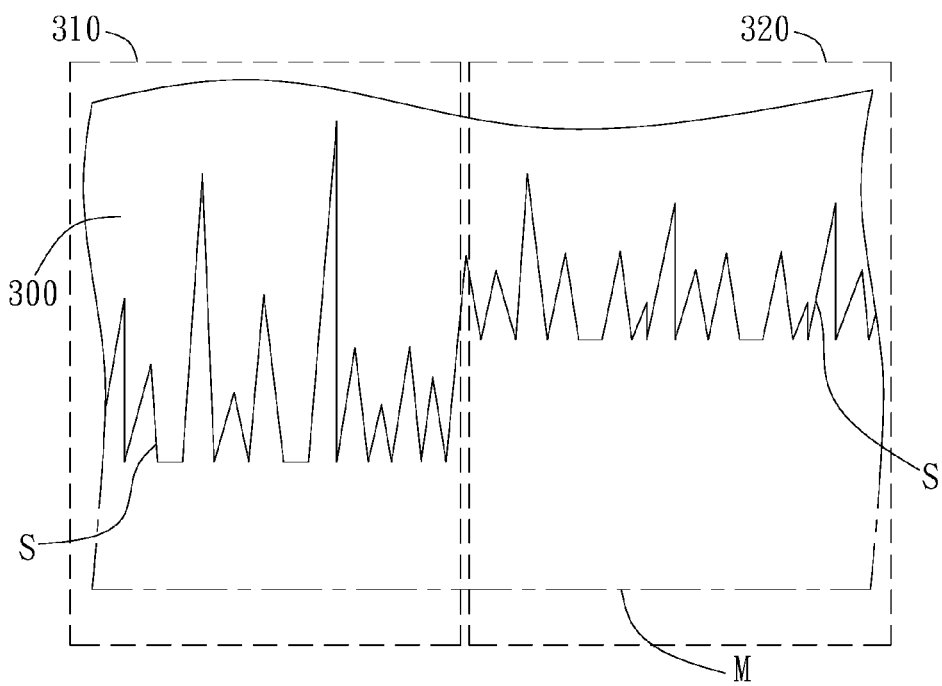
FIG. 8 shows partial cross-sectional view of the embodiment shown in FIG. 1B.

In addition to the indentations resulted from the etching on the bottom surface 300 of the substrate 100, the energy beam may result in notches S in the first area 310 and the second area 320. Please refer to the cross-sectional view shown in FIG. 8, wherein an outline represented by linetype "M" shows a range of the bottom surface 300 of the substrate 100 before the etching. The notches S such as sawtooth-like notches formed in the first area 310 and the second area 320 can be seen when observing the bottom surface 300 of the substrate 100 in detail; in other words, the substrate 100 of the display module 10 of the present invention has a character of notches on the bottom surface 300.

In the embodiments of the present invention, different energy can be applied to etching different areas such as the first area 310 and the second area 320 of the bottom surface 300. The first area 310 corresponds to the visual area 210 and requires slighter energy for releasing, the second area 320 corresponds to the signal area 220 and requires greater energy for releasing; when relative slighter energy is applied to etching per unit area of the first area 310 of the bottom surface 300 and relative greater energy is applied to etching per unit area of the second area 320, a portion of the substrate 100 having the first area 310 undergo the releasing process, wherein the releasing process affects elements in the visual area 210 in a minimum level; on the other hand, a portion of the substrate 100 having the second area 320 can be released completely. The manufacturing method of the substrate 100 of the display module 10 of the present invention further includes step 850, which is separating the substrate 100 from the transparent carrier plate. As shown in FIG. 4A(g), in the step 850, the substrate 100 is easily separated from the transparent carrier plate 600 and the manufacture of the substrate of the display module is completed.

Although the preferred embodiments of present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. A display module, comprising:
   a substrate having a bottom surface and a supporting surface opposite to the bottom surface; wherein the bottom surface has a first area and a second area; wherein a first average thickness between the first area and the supporting surface is greater than a second average thickness between the second area and the supporting surface;
   a plurality of pixel units disposed on a visual area of the supporting surface, wherein the visual area corresponds to the first area; and
   a plurality of signal circuits and a driving circuit disposed on a signal area of the supporting surface, wherein the signal area corresponds to the second area, and the bottom surface in the first area is lower than the bottom surface in the second area.

2. The display module of claim 1, further comprising:
   a glue material filling between the driving circuit and the pixel units.

3. The display module of claim 1, wherein a difference between the first average thickness and the second average thickness is greater than 10 nm.

4. The display module of claim 1, wherein the first area has a plurality of first indentations, a first distance exists between two adjacent indentations; the second area has a plurality of second indentations, a second distance exists between two adjacent second indentations; and the first distance is greater than the second distance.

5. The display module of claim 1, wherein the first area has a plurality of first indentations, a first width exists each of the first indentations; the second area has a plurality of second indentations, a second width exists each of the second indentations; and the first width is smaller than the second width.

6. The display module of claim 1, wherein notches resulted from etching of energy beams are distributed in the first area and the second area.

7. A display module, comprising:
- a substrate having a bottom surface and a supporting surface opposite to the bottom surface; wherein the bottom surface has a first area and a second area, the first area having a plurality of first indentations, the second area having a plurality of second indentations; wherein a first average thickness between the first area and the supporting surface is greater than a second average thickness between the second area and the supporting surface;
- a plurality of pixel units disposed on a visual area of the supporting surface, wherein the visual area corresponds to the first area; and
- a plurality of signal circuits and a driving circuit disposed on a signal area of the supporting surface, wherein the signal area corresponds to the second area.

* * * * *